United States Patent
Oh et al.

(10) Patent No.: US 8,952,360 B2
(45) Date of Patent: Feb. 10, 2015

(54) ORGANIC LIGHT-EMITTING DISPLAY APPARATUS AND METHOD OF MANUFACTURING THE SAME

(75) Inventors: Sang-Hun Oh, Yongin (KR); Gyoo-Chul Jo, Yongin (KR)

(73) Assignee: Samsung Display Co., Ltd., Yongin, Gyeonggi-Do (KR)

( * ) Notice: Subject to any disclaimer, the term of this patent is extended or adjusted under 35 U.S.C. 154(b) by 21 days.

(21) Appl. No.: 13/552,847

(22) Filed: Jul. 19, 2012

(65) Prior Publication Data

US 2013/0161680 A1 Jun. 27, 2013

(30) Foreign Application Priority Data

Dec. 22, 2011 (KR) ........................ 10-2011-0140402

(51) Int. Cl.
*H01L 51/00* (2006.01)

(52) U.S. Cl.
USPC .................. 257/40; 257/98; 257/E51.022

(58) Field of Classification Search
None
See application file for complete search history.

(56) References Cited

U.S. PATENT DOCUMENTS

| | | | |
|---|---|---|---|
| 2003/0151056 A1* | 8/2003 | Yamazaki | 257/98 |
| 2003/0164674 A1* | 9/2003 | Imamura | 313/493 |
| 2008/0211399 A1* | 9/2008 | Ryuji et al. | 313/506 |
| 2009/0008643 A1* | 1/2009 | Yamazaki et al. | 257/59 |
| 2009/0021157 A1* | 1/2009 | Kim et al. | 313/504 |
| 2011/0284898 A1* | 11/2011 | Iwasaki | 257/98 |
| 2012/0313098 A1* | 12/2012 | Kim et al. | 257/59 |

FOREIGN PATENT DOCUMENTS

| | | |
|---|---|---|
| KR | 10-2006-0040238 A | 5/2006 |
| KR | 10-0730220 B1 | 6/2007 |
| KR | 10-0759437 B1 | 9/2007 |
| KR | 10-2009-0008627 | 1/2009 |
| WO | WO-2008/018137 A1 | 2/2008 |
| WO | WO-2008/142645 A1 | 11/2008 |

OTHER PUBLICATIONS

Merriam-Webster. 2014. Definition of "protrude" http://www.merriam-webster.com/dictionary/protrude.*
European Search Report dated Apr. 2, 2013.

* cited by examiner

*Primary Examiner* — Tan N Tran
*Assistant Examiner* — Scott R Wilson
(74) *Attorney, Agent, or Firm* — Lee & Morse, P.C.

(57) ABSTRACT

An organic light-emitting display apparatus includes a substrate, a first electrode on the substrate; an intermediate layer on the first electrode, the intermediate layer including an organic light-emitting layer; a second electrode on the intermediate layer, a first inorganic encapsulating layer on the second electrode, the first inorganic encapsulating layer defining a first groove formed therein; a first organic encapsulating layer that is in the first groove defined by the first inorganic encapsulating layer, the first organic encapsulating layer not extending beyond the first groove, and a second inorganic encapsulating layer on the first organic encapsulating layer.

18 Claims, 5 Drawing Sheets

ORGANIC LIGHT-EMITTING DISPLAY APPARATUS AND METHOD OF MANUFACTURING THE SAME

CROSS-REFERENCE TO RELATED PATENT APPLICATION

This application claims the benefit of Korean Patent Application No. 10-2011-0140402, filed on Dec. 22, 2011, in the Korean Intellectual Property Office, the disclosure of which is incorporated herein in its entirety by reference.

BACKGROUND

1. Field

Embodiments relate to an organic light-emitting display apparatus and a method of manufacturing the same.

2. Description of the Related Art

Recently, conventional display devices are being replaced with portable thin flat panel display devices. From among flat panel display devices, organic light-emitting display apparatuses, which are self-emissive display devices, are considered as the next-generation display devices because of their wide viewing angle, high contrast ratio, and high response speed.

SUMMARY

According to an aspect, there is provided an organic light-emitting display apparatus including a substrate, a first electrode on the substrate, an intermediate layer on the first electrode, the intermediate layer including an organic light-emitting layer, a second electrode on the intermediate layer, a first inorganic encapsulating layer on the second electrode, the first inorganic encapsulating layer defining a first groove, a first organic encapsulating layer in the first groove defined by the first inorganic encapsulating layer, the first organic encapsulating layer not extending beyond the first groove, and a second inorganic encapsulating layer on the first organic encapsulating layer. The intermediate layer may include an intermediate layer protrusion.

The second electrode may be spaced apart from the intermediate layer protrusion so as not to cover the intermediate layer protrusion. The first inorganic encapsulating layer may be spaced apart from the intermediate layer protrusion so as not to cover the intermediate layer protrusion.

The organic light-emitting display apparatus may include a plurality of subpixels. A plurality of the intermediate layers may be provided to correspond to the plurality of subpixels. The intermediate layer protrusion may be on at least one edge of each of the plurality of intermediate layers.

The first inorganic encapsulating layer may include a first inorganic protrusion that corresponds to the intermediate layer protrusion. The first inorganic protrusion may be disposed around the first groove.

The first organic encapsulating layer may be spaced apart from an uppermost portion of the first inorganic protrusion. The first organic encapsulating layer may be spaced apart from the intermediate layer protrusion. At least one portion of the intermediate layer protrusion may contact the second inorganic encapsulating layer.

The organic light-emitting display apparatus may further include a pixel defining film disposed on the first electrode so as not to cover a portion of a top surface of the first electrode. The intermediate layer protrusion may be disposed to correspond to the pixel defining film.

The first inorganic encapsulating layer and the second inorganic encapsulating layer may contact each other at at least one portion of the first inorganic encapsulating layer.

The second inorganic encapsulating layer may define a second groove. The organic light-emitting display apparatus may further include a second organic encapsulating layer disposed in the second groove of the second inorganic encapsulating layer so as not to extend beyond the second groove and a third inorganic encapsulating layer on the second organic encapsulating layer.

The second inorganic encapsulating layer may include a second inorganic protrusion disposed around the second groove. The second organic encapsulating layer may be spaced apart from an uppermost portion of the second inorganic protrusion.

The second organic encapsulating layer may be spaced apart from the intermediate layer protrusion. The second inorganic encapsulating layer and the third inorganic encapsulating layer may contact each other at at least one portion of the second inorganic encapsulating layer.

The organic light-emitting display apparatus may further include at least one additional organic encapsulating layer and at least one additional inorganic encapsulating layer on the third inorganic encapsulating layer.

A top surface of an uppermost organic encapsulating layer from among the at least one additional organic encapsulating layer formed on the third inorganic encapsulating layer may be flat.

A top surface of an uppermost inorganic encapsulating layer from among the at least one additional inorganic encapsulating layer formed on the third inorganic encapsulating layer may be flat.

According to an embodiment, there is provided a method of manufacturing an organic light-emitting display apparatus, the method including forming a first electrode on a substrate, forming on the first electrode an intermediate layer, the intermediate layer including an organic light-emitting layer on the first electrode, forming a second electrode on the intermediate layer, forming a first inorganic encapsulating layer on the second electrode, the first inorganic encapsulating layer defining a first groove, forming a first organic encapsulating layer in the first groove defined by the first inorganic encapsulating layer such that the first organic encapsulating layer does not to extend beyond the first groove, and forming a second inorganic encapsulating layer on the first organic encapsulating layer. The intermediate layer may be formed by an imaging process.

BRIEF DESCRIPTION OF THE DRAWINGS

The above and other features will become more apparent by describing in detail exemplary embodiments thereof with reference to the attached drawings in which.

DETAILED DESCRIPTION

Embodiments will now be described more fully with reference to the accompanying drawings, in which exemplary embodiments of the invention are shown.

Figure 1:
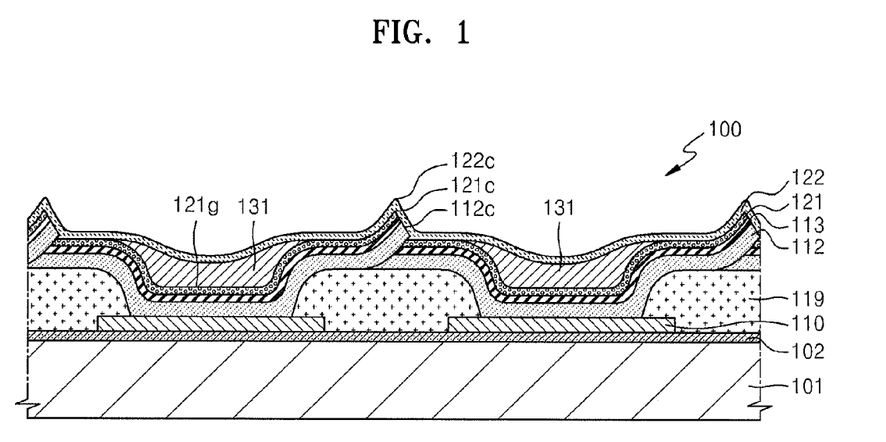
FIG. 1 is a cross-sectional view illustrating an organic light-emitting display apparatus according to an embodiment.

FIG. 1 is a cross-sectional view illustrating an organic light-emitting display apparatus 100 according to an embodiment.

Referring to FIG. 1, the organic light-emitting display apparatus 100 includes a substrate 101, a first electrode 110, an intermediate layer 112, a second electrode 113, a first inorganic encapsulating layer 121, a first organic encapsulating layer 131, and a second inorganic encapsulating layer 122.

The substrate 101 may be formed of a transparent glass material having $SiO_2$ as a main component. In other implementations, the substrate 101 may be formed of a transparent plastic material. In this case, the transparent plastic material of the substrate 101 may be at least one selected from various organic materials.

A buffer layer 102 may be formed on the substrate 101. The buffer layer 102, which may prevent impurity elements from penetrating through the substrate 101 and which planarizes the substrate 101, may be formed of any of various materials according to desired functions. For example, the buffer layer 102 may be formed of an inorganic material such as silicon oxide, silicon nitride, silicon oxynitride, aluminum oxide, aluminum nitride, titanium oxide, or titanium nitride, an organic material such as polyimide, polyester, or acryl, or a stack of the above materials. The buffer layer 102 may be omitted if desired.

The first electrode 110 may be formed on the buffer layer 102. The first electrode 110 may function as an anode and the second electrode 113 may function as a cathode, or vice versa.

If the first electrode 110 functions as an anode, the first electrode 110 may include indium tin oxide (ITO), indium zinc oxide (IZO) zinc oxide (ZnO), or $In_2O_3$ having a high work function. According to purpose and design conditions, the first electrode 110 may further include a reflective film formed of silver (Ag), magnesium (Mg), aluminum (Al), platinum (Pt), palladium (Pd), gold (Au), nickel (Ni), neodymium (Nd), iridium (Ir), chromium (Cr), lithium (Li), ytterbium (Yb), or calcium (Ca).

A pixel defining film 119 may be formed on the first electrode 110 by using an insulating material. In this case, the pixel defining film 119 may be formed to expose at least a portion of a top surface of the first electrode 110.

The intermediate layer 112 is formed on the first electrode 110. In this case, the intermediate layer 112 also covers or corresponds to the pixel defining film 119.

The intermediate layer 112 includes an organic light-emitting layer to generate visible light. The intermediate layer 112 may be a low molecular weight or polymeric organic film. If the intermediate layer 112 is a low molecular weight organic film, the intermediate layer 112 may include one or more of a hole injection layer (HIL), a hole transport layer (HTL), an electron transport layer (ETL), and an electron injection layer (EIL), in addition to the organic light-emitting layer.

The HIL may be formed of a phthalocyanine compound such as copper phthalocyanine or a starburst-type amine such as TCTA, m-MTDATA, or m-MTDAPB.

The HTL may be formed of N,N'-bis(3-methylphenyl)-N, N'-diphenyl-[1,1-biphenyl]-4,4'-diamine (TPD), or N,N'-di (naphthalene-1-yl)-N,N'-diphenylbenzidine (α-NPD).

The EIL may be formed of LiF, NaCl, CsF, $Li_2O$, BaO, or Liq.

The ETL may be formed of Alq3.

The organic light-emitting layer may include a host material and a dopant material.

Examples of the host material of the organic light-emitting layer may include tris(8-hydroxy-quinolinato)aluminum (Alq3), 9,10-di(naphth-2-yl)anthracene (ADN), 3-tert-butyl-9,10-di(naphth-2-yl)anthracene (TBADN), 4,4'-bis(2,2-diphenyl-ethene-1-yl)-4,4'-dimethylphenyl (DPVBi), 4,4'-bis(2,2-diphenyl-ethene-1-yl)-4,4'-dimethylphenyl (p-DMDPVBi), tert(9,9-diarylfluorene)s (TDAF), 2-(9,9'-spirobifluorene-2-yl)-9,9'-spirobifluorene (BSDF), 2,7-bis (9,9'-spirobifluorene-2-yl)-9,9'-spirobifluorene (TSDF), bis (9,9-diarylfluorene)s (BDAF), 4,4'-bis(2,2-diphenyl-ethene-1-yl)-4,4'-di-(tert-butyl)phenyl (p-TDPVBi), 1,3-bis (carbazol-9-yl)benzene(mCP), 1,3,5-tris(carbazol-9-yl) benzene (tCP), 4,4',4''-tris(carbazol-9-yl)triphenylamine (TcTa), 4,4'-bis(carbazol-9-yl)biphenyl (CBP), 4,4'-bis(9-carbazolyl)-2,2'-dimethyl-biphenyl (CBDP), 4,4'-bis(carbazol-9-yl)-9,9-dimethyl-fluorene (DMFL-CBP), 4,4'-bis(carbazol-9-yl)-9,9-bis(9-phenyl-9H-carbazol)fluorene (FL-4CBP), 4,4'-bis(carbazol-9-yl)-9,9-di-tolyl-fluorene (DPFL-CBP), or 9,9-bis(9-phenyl-9H-carbazol)fluorine (FL-2CBP).

Examples of the dopant material of the organic light-emitting layer may include DPAVBi (4,4'-bis[4-(di-p-tolylamino) styryl]biphenyl), ADN (9,10-di(naphth-2-yl)anthracene), or TBADN (3-tert-butyl-9,10-di(naphth-2-yl)anthracene).

The intermediate layer 112 may include at least one protrusion 112c. The protrusion 112c may be formed by various methods. For example, the protrusion 112c may be formed when the intermediate layer 112 is formed.

In particular, the protrusion 112c may be formed to correspond in position to the pixel defining film 119. A plurality of the intermediate layers 112 may be formed to correspond to a plurality of the first electrodes 110 and the protrusion 112c may protrude from at least one edge of each of the plurality of intermediate layers 112.

The second electrode 113 is formed on the intermediate layer 112. If the second electrode 113 functions as a cathode, the second electrode 113 may be formed of a metal such as Ag, Mg, Al, Pt, Pd, Au, Ni, Nd, Ir, Cr, Li, or Ca. Also, the second electrode 113 may include ITO, IZO, ZnO, or $In_2O_3$ to allow light to pass therethrough. The second electrode 113 may be a common electrode to apply a common voltage to all subpixels.

The second electrode 113 may not completely cover the intermediate layer 112. For example, the protrusion 112c of the intermediate layer 112 may not be covered by the second electrode 113 to be exposed. Due to a thickness of the second electrode 113 or characteristics of a process of forming the second electrode 113, the intermediate layer 112, particularly, the protrusion 112c, may not be completely covered by the second electrode 113. In other implementation, the protrusion 112c may be completely covered by the second electrode 113.

The first inorganic encapsulating layer 121 is formed on the second electrode 113. The first inorganic encapsulating layer 121 includes a first groove 121g and a first protrusion 121c. In detail, the first protrusion 121c may be disposed around the first groove 121g. Also, the first protrusion 121c may be formed to correspond to the protrusion 112c of the intermediate layer 112.

The first inorganic encapsulating layer 121 may not completely cover the intermediate layer 112. For example, the protrusion 112c of the intermediate layer 112 may not be covered by the second electrode 113 to be exposed, and the first inorganic encapsulating layer 121 may not cover the intermediate layer 112, particularly, the protrusion 112c of the intermediate layer 112. For example, the protrusion 121c of the first inorganic encapsulating layer 121 corresponding to the protrusion 112c of the intermediate layer 112 may not completely cover the protrusion 112c, and thus the protrusion 112c of the intermediate layer 112 may be exposed.

In other implementations, the protrusion 112c of the intermediate layer 112 may be completely covered by the first inorganic encapsulating layer 121.

The first organic encapsulating layer 131 is disposed on the first inorganic encapsulating layer 121. In detail, the first organic encapsulating layer 131 may be disposed in the first groove 121g of the first inorganic encapsulating layer 121 so as not to extend beyond the first groove 121g. Also, the first organic encapsulating layer 131 may be spaced apart from the protrusion 112c of the intermediate layer 112. Accordingly, the first organic encapsulating layer 131 may be prevented from contacting the intermediate layer 112.

The first organic encapsulating layer 131 is spaced apart from an uppermost portion of the first inorganic protrusion 121c of the first inorganic encapsulating layer 121.

The second inorganic encapsulating layer 122 is formed on the first organic encapsulating layer 131. The second inorganic encapsulating layer 122 covers the first organic encapsulating layer 131 and the first inorganic encapsulating layer 121. Also, the second inorganic encapsulating layer 122 may be formed to cover the intermediate layer 112. Accordingly, the second inorganic encapsulating layer 122 may contact the protrusion 112c of the intermediate layer 112.

The second inorganic encapsulating layer 122 is formed to contact the first inorganic encapsulating layer 121 at at least one portion of the inorganic encapsulating layer 121. A portion of the first inorganic encapsulating layer 121 where the first organic encapsulating layer 131 does not contact the first inorganic encapsulating layer 121 may contact the second inorganic encapsulating layer 122. For example, the first inorganic encapsulating layer 121 and the second inorganic encapsulating layer 122 may contact each other at a portion of the inorganic encapsulating layer 121 corresponding to or overlapping the pixel defining film 119. Accordingly, an adhesive force between the first inorganic encapsulating layer 121 and the second inorganic encapsulating layer 122 and an adhesive force between the first and second inorganic encapsulating layers 121 and 122 and the first organic encapsulating layer 131 disposed between the first and second inorganic encapsulating layers 121 and 122 may be improved.

The second inorganic encapsulating layer 122 includes a second inorganic protrusion 122c corresponding to the first inorganic protrusion 121c of the first inorganic encapsulating layer 121.

Each of the first inorganic encapsulating layer 121 and the second inorganic encapsulating layer 122 may include any of various inorganic materials such as silicon oxide or silicon nitride.

The first organic encapsulating layer 131 may include any of various organic materials such as epoxy or polyimide.

In the organic light-emitting display apparatus 100, the first inorganic encapsulating layer 121, the first organic encapsulating layer 131, and the second inorganic encapsulating layer 122 are stacked on the second electrode 113. Accordingly, the intermediate layer 112, the first electrode 110, and the second electrode 113 may be effectively protected.

In this case, when the protrusion 112c of the intermediate layer 112 is formed, the first inorganic encapsulating layer 121 and the second electrode 113 disposed on the intermediate layer 112 do not completely cover the intermediate layer 112, and the protrusion 112c of the intermediate layer 112 is exposed. When the first organic encapsulating layer 131 is formed, if the first organic encapsulating layer 131 were to contact the intermediate layer 112, the intermediate layer 112 may be contaminated with an impurity material or an organic material in the first organic encapsulating layer 131.

However, in FIG. 1, the first organic encapsulating layer 131 is disposed in the first groove 121g of the first inorganic encapsulating layer 121 not to extend beyond the first groove 121g. The first organic encapsulating layer 131 and the intermediate layer 112 may be prevented from contacting each other. Accordingly, the intermediate layer 112 may be prevented from being contaminated with an impurity material or an organic material in the first organic encapsulating layer 131.

The second inorganic encapsulating layer 122 may be formed on the first organic encapsulating layer 131 to completely isolate the intermediate layer 112 from the outside.

As a result, the intermediate layer 112 may be prevented from being contaminated due to the first organic encapsulating layer 131 and the first electrode 110. Accordingly, the intermediate layer 112 and the second electrode 113 may be effectively kept free from external foreign substances, moisture, and gas. The durability of the organic light-emitting display apparatus 100 may be improved and the electrical characteristics of the organic light-emitting display apparatus 100 may be effectively maintained.

Figure 2:
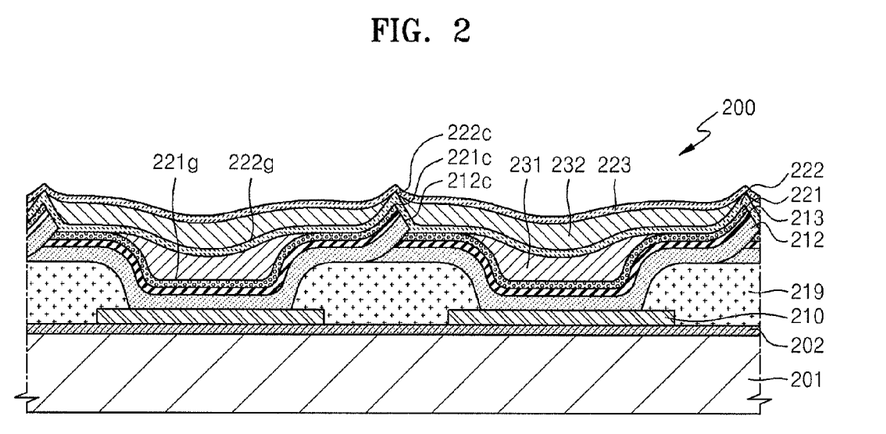
FIG. 2 is a cross-sectional view illustrating an organic light-emitting display apparatus according to another embodiment.

FIG. 2 is a cross-sectional view illustrating an organic light-emitting display apparatus 200 according to another embodiment.

Referring to FIG. 2, the organic light-emitting display apparatus 200 includes a substrate 201, a first electrode 210, an intermediate layer 212, a second electrode 213, a first inorganic encapsulating layer 221, a first organic encapsulating layer 231, a second inorganic encapsulating layer 222, a second organic encapsulating layer 232, and a third inorganic encapsulating layer 223.

Compared to the organic light-emitting display apparatus 100 of FIG. 1, the organic light-emitting display apparatus 200 of FIG. 2 further includes the second organic encapsulating layer 232 and the third inorganic encapsulating layer 223. The organic light-emitting display apparatus 200 of FIG. 2 is similar in configuration to the organic light-emitting display apparatus 100 of FIG. 1 except for further including the second organic encapsulating layer 232 and the third inorganic encapsulating layer 223.

For convenience of explanation, the following explanation will focus on a difference between the organic light-emitting display apparatus 200 of FIG. 2 and the organic light-emitting display apparatus 100 of FIG. 1.

The substrate 201, the first electrode 210, the intermediate layer 212, a pixel defining film 219, the second electrode 213, the first inorganic encapsulating layer 221, the first organic encapsulating layer 231, and the second inorganic encapsulating layer 222 are similar to those described with reference to FIG. 1 and thus a detailed explanation thereof will not be repeated.

Referring to FIG. 2, the second inorganic encapsulating layer 222 includes a second groove 222g. The second organic encapsulating layer 232 is formed on the second inorganic encapsulating layer 222. In detail, the second organic encapsulating layer 232 is disposed in the second groove 222g of the second inorganic encapsulating layer 222 so as not to extend beyond the second groove 222g.

The second organic encapsulating layer 232 is spaced apart from an uppermost portion of a second inorganic protrusion 222c of the second inorganic encapsulating layer 222.

The third inorganic encapsulating layer 223 may be formed on the second organic encapsulating layer 232. The third inorganic encapsulating layer 223 covers the second organic encapsulating layer 232 and the second inorganic encapsulating layer 222.

The third inorganic encapsulating layer 223 may be formed to contact the second inorganic encapsulating layer 222 at at least one portion of the second inorganic encapsulating layer 222. A portion of the second inorganic encapsulating layer 222 where the second organic encapsulating layer 232 does not contact the second inorganic encapsulating layer 222 may contact the third inorganic encapsulating layer 223. In detail, the third inorganic encapsulating layer 223 and the second inorganic encapsulating layer 222 may contact each other at a portion corresponding to or overlapping the pixel defining film 219. Accordingly, an adhesive force between the second inorganic encapsulating layer 222 and the third inorganic encapsulating layer 223 and an adhesive force between the second and third inorganic encapsulating layers 222 and 223 and the second organic encapsulating layer 232 disposed between the second and third inorganic encapsulating layers 222 and 223 may be improved.

In the organic light-emitting display apparatus 200 of FIG. 2, the first inorganic encapsulating layer 221, the first organic encapsulating layer 231, the second inorganic encapsulating layer 222, the second organic encapsulating layer 232, and the third inorganic encapsulating layer 223 are sequentially stacked. Accordingly, the intermediate layer 112, the first electrode 110, and the second electrode 113 may be effectively protected.

When the second inorganic encapsulating layer 222 is formed, the second inorganic encapsulating layer 222 may not completely cover the intermediate layer 212 according to design conditions. In particular, the second inorganic encapsulating layer 222 may not completely cover the protrusion 212c of the intermediate layer 212. In this case, the second organic encapsulating layer 232 and the intermediate layer 212 may be prevented from contacting each other by disposing the second organic encapsulating layer 232 in the second groove 222g of the second inorganic encapsulating layer 222 so as not to extend beyond the second groove 222g. Accordingly, the intermediate layer 212 may be prevented from being contaminated with an impurity material or an organic material in the second organic encapsulating layer 232.

As a result, the intermediate layer 212 is prevented from being contaminated due to the first organic encapsulating layer 231 and the second organic encapsulating layer 232 and the first electrode 210. Accordingly, the intermediate layer 212, and the second electrode 213 may be effectively kept free from an external foreign substance, moisture, and gas. The durability of the organic light-emitting display apparatus 200 may be improved and the electrical characteristics of the organic light-emitting display apparatus 200 may be effectively maintained.

Figure 3:
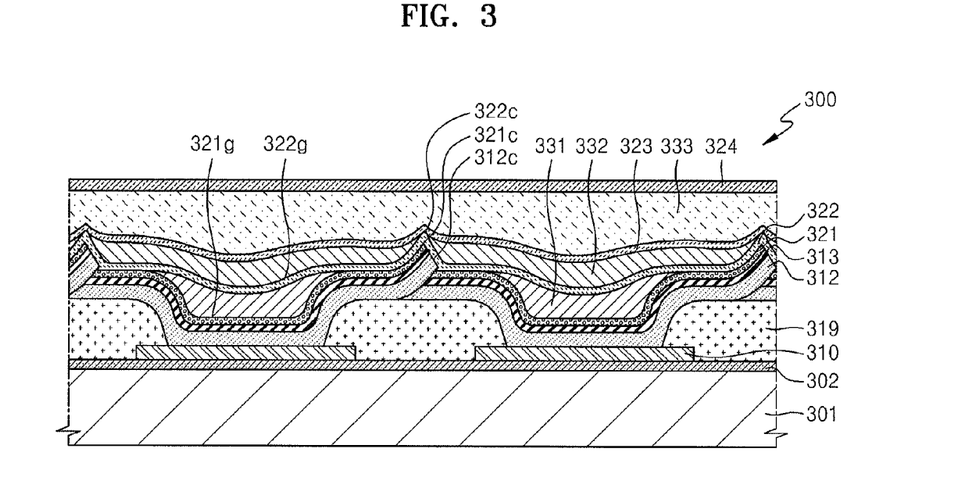
FIG. 3 is a cross-sectional view illustrating an organic light-emitting display apparatus according to another embodiment.

FIG. 3 is a cross-sectional view illustrating an organic light-emitting display apparatus 300 according to another embodiment.

Referring to FIG. 3, the organic light-emitting display apparatus 300 includes a substrate 301, a first electrode 310, an intermediate layer 312, a second electrode 313, a first inorganic encapsulating layer 321, a first organic encapsulating layer 331, a second inorganic encapsulating layer 322, a second organic encapsulating layer 332, a third inorganic encapsulating layer 323, a third organic encapsulating layer 333, and a fourth inorganic encapsulating layer 324.

Compared to the organic light-emitting display apparatus 200 of FIG. 2, the organic light-emitting display apparatus 300 of FIG. 3 further includes the third organic encapsulating layer 333 and the fourth inorganic encapsulating layer 324. That is, the organic light-emitting display apparatus 300 of FIG. 3 is similar in configuration to the organic light-emitting display apparatus 200 of FIG. 2 except for further including the third organic encapsulating layer 333 and the fourth inorganic encapsulating layer 324.

For convenience of explanation, the following explanation will focus on a difference between the organic light-emitting display apparatus 300 of FIG. 3 and the organic light-emitting display apparatus 100 and 200 of FIGS. 1 and 2.

The substrate 301, the first electrode 310, the intermediate layer 312, a pixel defining film 319, the second electrode 313, the first inorganic encapsulating layer 321, the first organic encapsulating layer 331, the second inorganic encapsulating layer 322, the second organic encapsulating layer 332, and the third inorganic encapsulating layer 323 are similar in configuration to those described with reference to FIGS. 1 and 2, and thus a detailed explanation thereof will not be repeated.

Referring to FIG. 3, the third organic encapsulating layer 333 may be formed on the third inorganic encapsulating layer 323. The third organic encapsulating layer 333 having a flat top surface may be formed to planarize members disposed under the third organic encapsulating layer 333. To this end, the third organic encapsulating layer 333 may be formed to have an appropriate thickness. A thickness of the third organic encapsulating layer 333 may be greater than a thickness of the first organic encapsulating layer 331 and a thickness of the second organic encapsulating layer 332.

The fourth inorganic encapsulating layer 324 may be formed on the third organic encapsulating layer 333. The fourth inorganic encapsulating layer 324 covers the third organic encapsulating layer 333. Also, the fourth inorganic encapsulating layer 324 has a flat top surface.

In the organic light-emitting display apparatus 300 of FIG. 3, the first inorganic encapsulating layer 321, the first organic encapsulating layer 331, the second inorganic encapsulating layer 322, the second organic encapsulating layer 332, the third inorganic encapsulating layer 323, the third organic encapsulating layer 333, and the fourth inorganic encapsulating layer 324 are sequentially stacked. Accordingly, the intermediate layer 312, the first electrode 310, and the second electrode 313 may be effectively protected.

Top surfaces of the third organic encapsulating layer 333 and the fourth inorganic encapsulating layer 324 are flat so that the organic light-emitting display apparatus 300 is easily coupled to an additional member such as a case member (not shown). Accordingly, the durability and convenience of the organic light-emitting display apparatus 300 may be improved. Also, visible light emitted from the intermediate layer 312 finally passes through the flat top surfaces to have uniform characteristics. Accordingly, image quality may be improved.

Also, the intermediate layer 312 may be prevented from being contaminated due to the first organic encapsulating layer 331, the second organic encapsulating layer 332, and the third organic encapsulating layer 333 and the first electrode 310. Accordingly, the intermediate layer 312, and the second electrode 313 are effectively kept free from an external foreign substance, moisture, and gas. The durability of the organic light-emitting display apparatus 300 may be improved and the electrical characteristics of the organic light-emitting display apparatus 300 may be effectively maintained.

Although three organic encapsulating layers, that is, the first through third organic encapsulating layers 331, 332, and 333, and four inorganic encapsulating layers, that is, the first through fourth inorganic encapsulating layers 321, 322, 323, and 324, are illustrated in FIG. 3, the present embodiment is not limited thereto. That is, four or more organic encapsulating layers and five or more inorganic encapsulating layers may be formed. In this case, a top surface of an uppermost organic encapsulating layer may be flat, and a top surface of an uppermost inorganic encapsulating layer may be flat.

Figure 4:
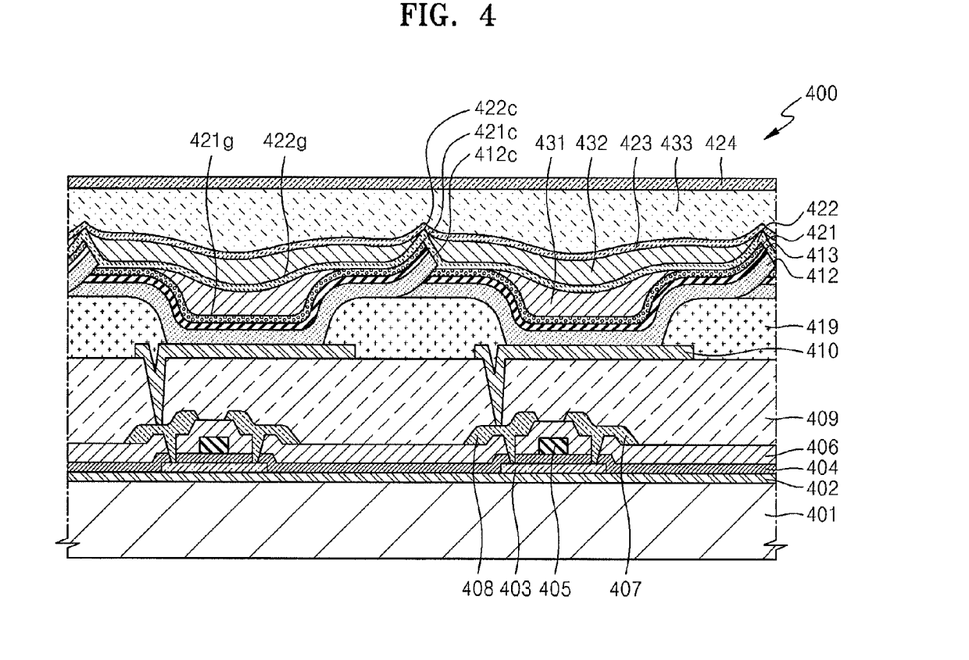
FIG. 4 is a cross-sectional view illustrating an organic light-emitting display apparatus according to another embodiment.

FIG. 4 is a cross-sectional view illustrating an organic light-emitting display apparatus 400 according to another embodiment.

Referring to FIG. 4, the organic light-emitting display apparatus 400 includes a substrate 401, a thin film transistor (TFT), a first electrode 410, an intermediate layer 412, a second electrode 413, a first inorganic encapsulating layer 421, a first organic encapsulating layer 431, a second inorganic encapsulating layer 422, a second organic encapsulating layer 432, a third inorganic encapsulating layer 423, a third organic encapsulating layer 433, and a fourth inorganic encapsulating layer 424.

The TFT may include an active layer 403, a gate electrode 405, a source electrode 407, and a drain electrode 408. It is to be understood that the TFT may vary from what is disclosed herein.

For convenience of explanation, the following explanation will focus on a difference between the organic light-emitting display apparatus 400 of FIG. 4 and the organic light-emitting display apparatus 100, 200, and 300 of FIGS. 1 through 3.

A buffer layer 402 may be formed on the substrate 401. The active layer 403 having a predetermined pattern may be formed on the buffer layer 402. The active layer 403 may be formed of an organic semiconductor or an inorganic semiconductor such as amorphous silicon or polysilicon, and may include a source region, a drain region, and a channel region.

A gate insulating film 404 may be formed on the active layer 403. The gate electrode 405 may be formed on the gate insulating film 404. The gate insulating film 404 for insulating the active layer 403 from the gate electrode 405 may be formed of an organic material or an inorganic material such as $SiN_x$ or $SiO_2$.

The gate electrode 405 may include Au, Ag, Cu, Ni, Pt, Pd, Al, or Mo, or may include an alloy such as Al:Nd or Mo:W. Other suitable materials may be used. The gate electrode 405 may be formed of any of various materials by considering adhesion, flatness, electrical resistance, and processability with respect to an adjacent layer.

An interlayer insulating film 406 may be formed on the gate electrode 405. The interlayer insulating film 406 and the gate insulating film 404 are formed to expose the source region and the drain region of the active layer 403, and the source electrode 407 and the drain electrode 408 are formed to contact the exposed source region and drain region of the active layer 403.

Each of the source electrode 407 and the drain electrode 408 may be formed of any of various conductive materials, and may have a single-layer structure or a multi-layer structure.

A passivation layer 409 may be formed on the source electrode 407 and the drain electrode 408. The passivation layer 409 may be formed to expose a portion of the drain electrode 408 without entirely covering the drain electrode 408, and the first electrode 410 is formed to be connected to the exposed portion of the drain electrode 408.

A pixel defining film 419, the intermediate layer 412, and the second electrode 413 are formed on the first electrode 410. Also, the first inorganic encapsulating layer 421, the first organic encapsulating layer 431, the second inorganic encapsulating layer 422, the second organic encapsulating layer 432, the third inorganic encapsulating layer 423, the third organic encapsulating layer 433, and the fourth inorganic encapsulating layer 424 are formed.

The first inorganic encapsulating layer 421, the first organic encapsulating layer 431, the second inorganic encapsulating layer 422, the second organic encapsulating layer 432, the third inorganic encapsulating layer 423, the third organic encapsulating layer 433, and the fourth inorganic encapsulating layer 424 are the same as those described with reference to FIGS. 1 through 3, and thus a detailed explanation thereof will not be repeated.

In the organic light-emitting display apparatus 400 of FIG. 4, the first inorganic encapsulating layer 421, the first organic encapsulating layer 431, the second inorganic encapsulating layer 422, the second organic encapsulating layer 432, the third inorganic encapsulating layer 423, the third organic encapsulating layer 433, and the fourth inorganic encapsulating layer 424 are sequentially stacked. Accordingly, the intermediate layer 412, the first electrode 410, and the second electrode 413 may be effectively protected.

Top surfaces of the third organic encapsulating layer 433 and the fourth inorganic encapsulating layer 424 are flat so that the organic light-emitting display apparatus 400 may be easily coupled to an additional member such as a case member (not shown). Accordingly, industrial applicability may be improved. Also, visible light emitted from the intermediate layer 412 finally passes through the flat top surfaces to have uniform characteristics. Accordingly, image quality may be improved.

Also, since the intermediate layer 412 is prevented from being contaminated due to the first organic encapsulating layer 431, the second organic encapsulating layer 432, and the third organic encapsulating layer 433 and the first electrode 410, the intermediate layer 412, and the second electrode 413 are effectively kept free from an external foreign substance, moisture, and gas, the durability of the organic light-emitting display apparatus 400 may be improved and the electrical characteristics of the organic light-emitting display apparatus 400 may be effectively maintained.

FIGS. 5A through 5E are cross-sectional views illustrating stages of a method of manufacturing an organic light-emitting display apparatus, according to an embodiment. In detail, FIGS. 5A through 5E are cross-sectional views for explaining a method of manufacturing the organic light-emitting display apparatus 400 of FIG. 4.

The method will be explained in detail sequentially with reference to FIGS. 5A through 5E.

Figure 5A:
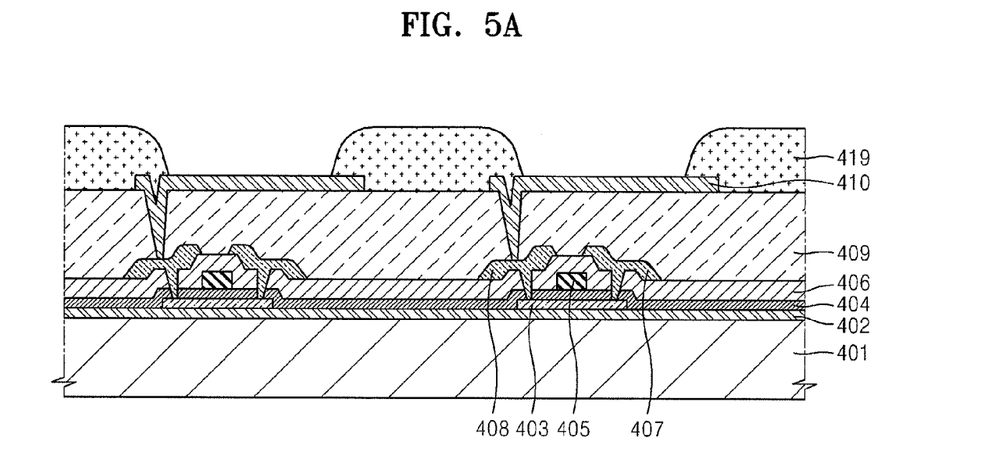
FIGS. 5A through 5E are cross-sectional views illustrating stages of a method of manufacturing an organic light-emitting display apparatus, according to an embodiment.

Referring to FIG. 5A, the buffer layer 402 may be formed on the substrate 401, the active layer 403 may be formed on the buffer layer 402, the gate insulating film 404 may be formed on the active layer 403, the gate electrode 405 may be formed on a predetermined portion of the gate insulating film 404, the interlayer insulating film 406 may be formed on the gate electrode 405, and the source electrode 407 and the drain electrode 408 may be formed on the interlayer insulating film 406. The passivation layer 409 may be formed on the source electrode 407 and the drain electrode 408, the first electrode 410 may be formed on the passivation layer 409 to be connected to the drain electrode 408, and the pixel defining film 419 may be formed on the first electrode 410. In this case, at least one portion of a top surface of the first electrode 410 is not covered by the pixel defining film 419 and remains exposed.

Figure 5B:
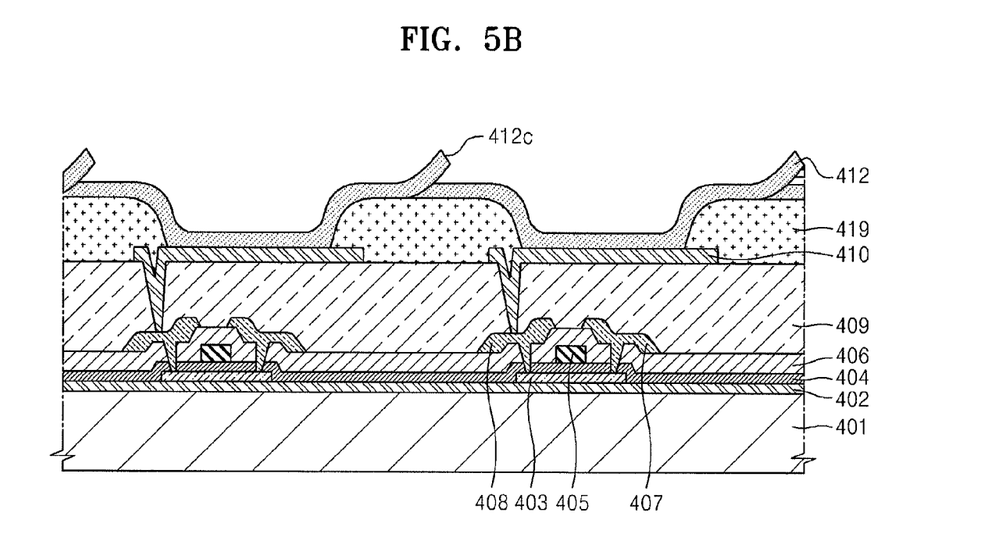

Referring to FIG. 5B, the intermediate layer 412 is formed. In this case, the intermediate layer 412 is formed to contact the first electrode 410. Also, the intermediate layer 412 may be formed to correspond to the pixel defining film 419.

The intermediate layer 412 may not be smooth and may include a protrusion 412c. As shown in FIG. 5B, a plurality of the intermediate layers 412 are formed to correspond to a plurality of the first electrodes 410, and the plurality of first electrodes 410 correspond to subpixels. The plurality of intermediate layers 412 may be provided to respectively correspond to the plurality of subpixels. In this case, at least one protrusion 412c may protrude from an edge of each of the plurality of intermediate layer 412.

In particular, if the intermediate layer 412 is formed by using an imaging process such as laser induced thermal imaging (LITI), the protrusion 412 is likely to be formed. The intermediate layer 412 may also be formed using any of various methods besides imaging.

Figure 5C:
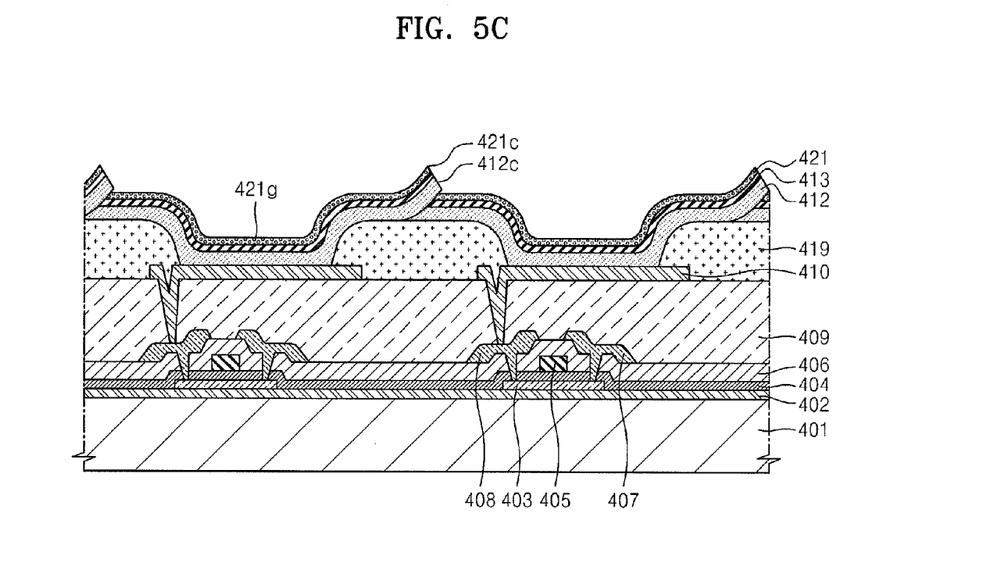

Referring to FIG. 5C, the second electrode 413 may be formed on the intermediate layer 412. The second electrode 413 does not completely cover the intermediate layer 412 such that the protrusion 412c of the intermediate layer 412 is exposed. A thickness of the protrusion 412c may be greater than a thickness of the second electrode 413. Accordingly, the protrusion 412c may not be completely covered by the second electrode 413.

The first inorganic encapsulating layer 421 may be formed on the second electrode 413. The first inorganic encapsulating layer 421 includes a first groove 421g and a first protrusion 421c. In detail, the first protrusion 421c is disposed around the first groove 421g. Also, the first protrusion 421c may be formed to correspond to the protrusion 412c of the intermediate layer 412.

The first inorganic encapsulating layer 421 may not completely cover the intermediate layer 412. For example, the protrusion 412c of the intermediate layer 412 which is not covered by the second electrode 413 to be exposed may not be covered by the first inorganic encapsulating layer 421 to be exposed. For example, the protrusion 421c of the first inorganic encapsulating layer 421 corresponding to the protrusion 412c of the intermediate layer 412 may not completely cover the protrusion 412c, and thus the protrusion 412c of the intermediate layer 412 may be exposed.

Figure 5D:
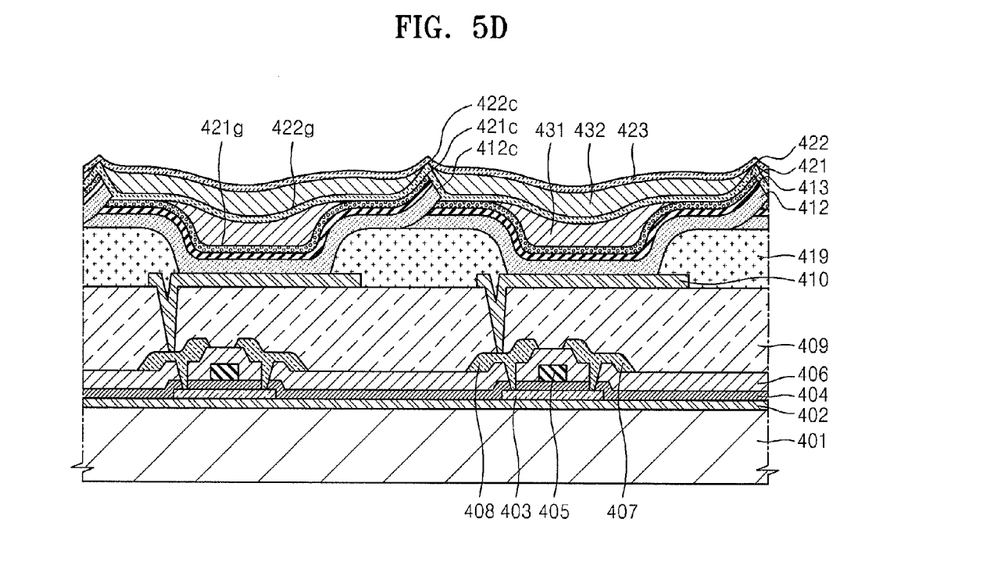

Referring to FIG. 5D, the first organic encapsulating layer 431, and the second inorganic encapsulating layer 422, the second organic encapsulating layer 432, the third inorganic encapsulating layer 423 are formed on the first inorganic encapsulating layer 421.

The first organic encapsulating layer 431 is disposed on the first inorganic encapsulating layer 421. In detail, the first organic encapsulating layer 431 is disposed in the first groove 421g of the first inorganic encapsulating layer 421 so as not to extend beyond the first groove 421g. Also, the first organic encapsulating layer 431 is spaced apart from the protrusion 412c of the intermediate layer 412. Accordingly, the first organic encapsulating layer 431 and the intermediate layer 412 may be prevented from contacting each other.

The first organic encapsulating layer 431 is spaced apart from an uppermost portion of the first inorganic protrusion 421c of the first inorganic encapsulating layer 421.

The second inorganic encapsulating layer 422 may be formed on the first organic encapsulating layer 431. The second inorganic encapsulating layer 422 covers the first organic encapsulating layer 431 and the first inorganic encapsulating layer 421. Also, the second inorganic encapsulating layer 422 may be formed to cover the intermediate layer 412. Accordingly, the second inorganic encapsulating layer 422 may contact the protrusion 412c of the intermediate layer 412.

The second inorganic encapsulating layer 422 may be formed to contact the first inorganic encapsulating layer 421 at at least one portion of the first inorganic encapsulating layer 421. That is, a portion of the first inorganic encapsulating layer 421 where the first organic encapsulating layer 431 does not contact the first inorganic encapsulating layer 421 contacts the second inorganic encapsulating layer 422.

Also, the second inorganic encapsulating layer 422 includes a second inorganic protrusion 422c corresponding to the first inorganic protrusion 421c of the first inorganic encapsulating layer 421. The second inorganic encapsulating layer 422 includes a second groove 422g.

The second organic encapsulating layer 432 may be formed on the second inorganic encapsulating layer 422. The second organic encapsulating layer 432 is disposed in the second groove 422g of the second inorganic encapsulating layer 422 not to extend beyond the second groove 422g. The second organic encapsulating layer 432 is spaced apart from an uppermost portion of the second inorganic protrusion 422c of the second inorganic encapsulating layer 422.

The third inorganic encapsulating layer 423 may be formed on the second organic encapsulating layer 432. The third inorganic encapsulating layer 423 covers the second organic encapsulating layer 432 and the second inorganic encapsulating layer 422.

The third inorganic encapsulating layer 423 may be formed to contact the second inorganic encapsulating layer 422 at at least one portion of the second inorganic encapsulating layer 422. That is, a portion of the second inorganic encapsulating layer 422 where the second organic encapsulating layer 432 does not contact the second inorganic encapsulating layer 422 contacts the third inorganic encapsulating layer 423.

Figure 5E:
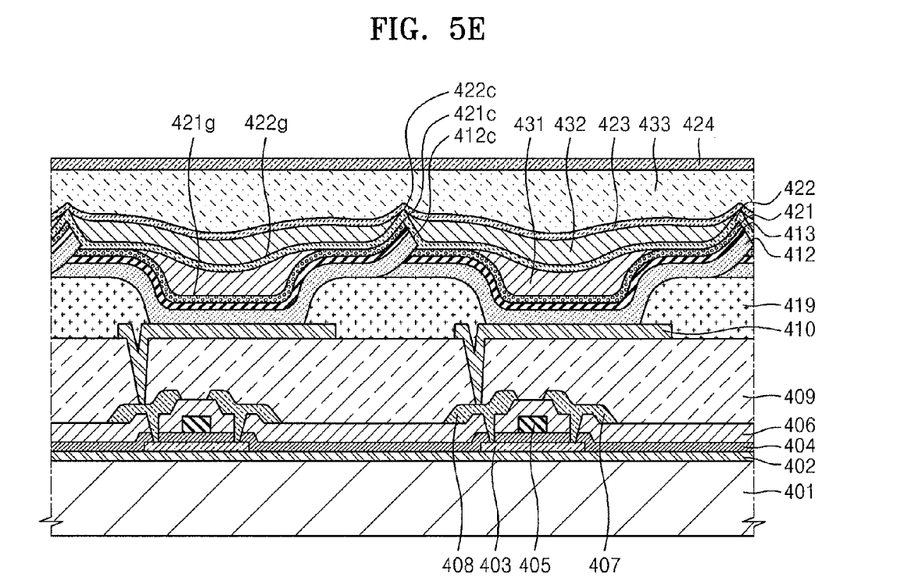

Referring to FIG. 5E, the third organic encapsulating layer 433, and the fourth inorganic encapsulating layer 424 are formed.

The third organic encapsulating layer 433 may be formed on the third inorganic encapsulating layer 423. The third organic encapsulating layer 433 having a flat top surface may be formed to planarize members disposed under the third organic encapsulating layer 433. To this end, the third organic encapsulating layer 433 may be formed to have a thickness greater than a thickness of each of the first organic encapsulating layer 431 and the second organic encapsulating layer 432.

The fourth inorganic encapsulating layer 424 may be formed on the third organic encapsulating layer 433. The fourth inorganic encapsulating layer 424 covers the third organic encapsulating layer 433. Also, the fourth inorganic encapsulating layer 424 has a flat top surface.

By way of summation and review, a typical organic light-emitting display apparatus includes an intermediate layer, a first electrode, and a second electrode. The intermediate layer includes an organic light-emitting layer, and the organic light-emitting layer generates visible light by applying a voltage to the first electrode and the second electrode. The intermediate layer which includes an organic material may be easily contaminated with an external foreign substance, moisture, or gas. Once the intermediate layer is contaminated, the durability and electrical characteristics of the organic light-emitting display apparatus may be drastically degraded.

According to embodiments, an organic light-emitting display apparatus and a method of manufacturing the same may easily provide improved durability and electrical characteristics.

While the embodiments have been particularly shown and described with reference to exemplary embodiments thereof, it will be understood by those of ordinary skill in the art that various changes in form and details may be made therein without departing from the spirit and scope thereof as defined by the following claims.

What is claimed is:

1. An organic light-emitting display apparatus comprising:
a substrate;
a first electrode on the substrate;
an intermediate layer on the first electrode, the intermediate layer including an intermediate layer protrusion, which protrudes from at least one edge of the intermediate layer, and an organic light-emitting layer;
a second electrode on the intermediate layer;
a first inorganic encapsulating layer on the second electrode, the first inorganic encapsulating layer defining a first groove;
a first organic encapsulating layer in the first groove defined by the first inorganic encapsulating layer, the first organic encapsulating layer not extending beyond the first groove; and
a second inorganic encapsulating layer on the first organic encapsulating layer,
wherein:
the second electrode is spaced apart from the intermediate layer protrusion so as not to cover the intermediate layer protrusion, and
the first inorganic encapsulating layer is spaced apart from the intermediate layer protrusion so as not to cover the intermediate layer protrusion.

2. The organic light-emitting display apparatus of claim 1, wherein:
the organic light-emitting display apparatus includes a plurality of subpixels,
a plurality of the intermediate layers are provided to correspond to the plurality of subpixels, and
the intermediate layer protrusion is on at least one edge of each of the plurality of intermediate layers.

3. The organic light-emitting display apparatus of claim 1, wherein:
the first inorganic encapsulating layer includes a first inorganic protrusion that corresponds to the intermediate layer protrusion, and
the first inorganic protrusion is disposed around the first groove.

4. The organic light-emitting display apparatus of claim 3, wherein the first organic encapsulating layer is spaced apart from an uppermost portion of the first inorganic protrusion.

5. The organic light-emitting display apparatus of claim 1, wherein the first organic encapsulating layer is spaced apart from the intermediate layer protrusion.

6. The organic light-emitting display apparatus of claim 1, further comprising a pixel defining film disposed on the first electrode so as not to cover a portion of a top surface of the first electrode,
wherein the intermediate layer protrusion is disposed to correspond to the pixel defining film.

7. The organic light-emitting display apparatus of claim 1, wherein the first inorganic encapsulating layer and the second inorganic encapsulating layer contact each other at least one portion of the first inorganic encapsulating layer.

8. The organic light-emitting display apparatus of claim 1, wherein:
the second inorganic encapsulating layer defines a second groove, and
the organic light-emitting display apparatus further comprises:
a second organic encapsulating layer disposed in the second groove of the second inorganic encapsulating layer so as not to extend beyond the second groove; and
a third inorganic encapsulating layer on the second organic encapsulating layer.

9. The organic light-emitting display apparatus of claim 8, wherein the second inorganic encapsulating layer includes a second inorganic protrusion disposed around the second groove.

10. The organic light-emitting display apparatus of claim 9, wherein the second organic encapsulating layer is spaced apart from an uppermost portion of the second inorganic protrusion.

11. The organic light-emitting display apparatus of claim 8, wherein the second organic encapsulating layer is spaced apart from the intermediate layer protrusion.

12. The organic light-emitting display apparatus of claim 8, wherein the second inorganic encapsulating layer and the third inorganic encapsulating layer contact each other at least one portion of the second inorganic encapsulating layer.

13. The organic light-emitting display apparatus of claim 8, further comprising at least one additional organic encapsulating layer and at least one additional inorganic encapsulating layer on the third inorganic encapsulating layer.

14. The organic light-emitting display apparatus of claim 13, wherein a top surface of an uppermost organic encapsulating layer from among the at least one additional organic encapsulating layer formed on the third inorganic encapsulating layer is flat.

15. The organic light-emitting display apparatus of claim 13, wherein a top surface of an uppermost inorganic encapsulating layer from among the at least one additional inorganic encapsulating layer formed on the third inorganic encapsulating layer is flat.

16. An organic light-emitting display apparatus comprising:
a substrate;
a first electrode on the substrate;
an intermediate layer on the first electrode, the intermediate layer including an intermediate layer protrusion, which protrudes from at least one edge of the intermediate layer, and an organic light-emitting layer;
a second electrode on the intermediate layer;
a first inorganic encapsulating layer on the second electrode, the first inorganic encapsulating layer defining a first groove;
a first organic encapsulating layer in the first groove defined by the first inorganic encapsulating layer, the first organic encapsulating layer not extending beyond the first groove; and
a second inorganic encapsulating layer on the first organic encapsulating layer,
wherein at least one portion of the intermediate layer protrusion contacts the second inorganic encapsulating layer.

17. A method of manufacturing an organic light-emitting display apparatus, the method comprising:
forming a first electrode on a substrate;
forming on the first electrode an intermediate layer, the intermediate layer including an intermediate layer protrusion, which protrudes from at least one edge of the intermediate layer, and an organic light-emitting layer on the first electrode;

forming a second electrode on the intermediate layer;

forming a first inorganic encapsulating layer on the second electrode, the first inorganic encapsulating layer defining a first groove;

forming a first organic encapsulating layer in the first groove defined by the first inorganic encapsulating layer such that the first organic encapsulating layer does not extend beyond the first groove; and forming a second inorganic encapsulating layer on the first organic encapsulating layer such that at least one portion of the intermediate layer protrusion contacts the second inorganic encapsulating layer.

18. The method of claim 17, wherein the intermediate layer is formed by an imaging process.

* * * * *